US005754619A

United States Patent [19]

Yoshihara et al.

[11] Patent Number: 5,754,619

[45] Date of Patent: May 19, 1998

[54] X-RAY MASK FOR X-RAY LITHOGRAPHY AND METHOD OF PRODUCING SAME

[75] Inventors: Takuya Yoshihara; Setsu Kotsuji, both of Tokyo, Japan

[73] Assignee: NEC Corporation, Tokyo, Japan

[21] Appl. No.: 773,836

[22] Filed: Dec. 27, 1996

[30] Foreign Application Priority Data

Jan. 9, 1996 [JP] Japan .................................... 8-001419

[51] Int. Cl.[6] .......................... G21K 5/00; H01L 21/027

[52] U.S. Cl. .................................. 378/35; 378/34; 430/5

[58] Field of Search ............................ 378/34, 35; 430/5

[56] References Cited

U.S. PATENT DOCUMENTS 5,196,283 3/1993 Ikeba et al. .......................... 378/35 X

FOREIGN PATENT DOCUMENTS 2-2109 1/1990 Japan .

OTHER PUBLICATIONS

Yabe et al., "Sputtered W–Ti Film for X–Ray Mask Absorber", Jpn. Journal of Applied Physics, vol. 31, (1992), pp. 4210–4214.

Sugawara et al., "Stress–free and Amorphous $Ta_4B$ or $Ta_8SiB$ Absorbers for X–Ray Masks", Journal Vac. Sci. Technol., vol. B7, No. 6, (1989), 1561-1564.

*Primary Examiner*—David P. Porta

*Attorney, Agent, or Firm*—Foley & Lardner

[57] ABSTRACT

In an X-ray mask for X-ray lithography, a Ta—Ge alloy is employed as the X-ray absorber to form a mask pattern on a membrane, which transmits X-rays, such as a SiC membrane. Ta—Ge is sufficiently high in absorption coefficient. The mask pattern is formed by depositing a Ta—Ge film on the membrane by sputtering and patterning the deposited film. Since the sputter-deposited Ta—Ge film is amorphous, sidewalls of the mask pattern become smooth even when the pattern is finer than 0.1 μm. The Ta—Ge film is high in chemical stability, and this film is relatively small in the dependence of internal stress on the pressure of the sputtering gas so that the stress can easily be controlled.

20 Claims, 3 Drawing Sheets

X-RAY MASK FOR X-RAY LITHOGRAPHY AND METHOD OF PRODUCING SAME

BACKGROUND OF THE INVENTION

This invention relates to an X-ray mask for X-ray lithography and a method of producing the X-ray mask. The X-ray mask is useful in the fabrication of a semiconductor integrated circuit or a micromachine, and in the X-ray mask a pattern of an X-ray absorber can be made very fine with the minimum feature size smaller than 0.1 μm.

In general, an X-ray mask for X-ray lithography has a mask pattern of an X-ray absorber on a film called a membrane, or a transmissive membrane, which transmits X-rays. For example, the membrane is a film of silicon nitride or silicon carbide. Usually the membrane is supported by a substrate in which a sufficiently large aperture is formed. According to the need, the substrate is attached to a supporting frame. The mask pattern is formed by first depositing an X-ray absorber film on the membrane and then patterning the absorber film by lithography and dry etching operations.

In X-ray lithography the X-ray mask is positioned in close proximity to a substrate or wafer coated with an X-ray resist, and the mask pattern is transferred into the X-ray resist layer by irradiating the mask with an X-ray flux. To realize sufficiently high contrast of the projected pattern image, the X-ray absorber on the mask is required to be high in X-ray stopping or absorbing power (represented by the product of mass absorption coefficient by density) particularly for X-ray wavelengths around 10 Å which are useful for 1:1 printing.

The X-ray absorber is further required to be low in internal stress in order to preserve positional and dimensional accuracy of the mask pattern and to be good in etchability by dry etching. Still further, with the desire of forming very fine patterns the X-ray absorber is required to have a fine structure in film form, to be high in chemical stability and to be uniform in in-plane distribution of internal stress.

In the recent past it was usual to use Ta or W as the X-ray absorber in X-ray masks. However, neither Ta nor W meets all of the above-mentioned requirements. As a serious problem, a sputter-deposited film of Ta or W has a columnar structure with relatively coarse grains. When a fine pattern is formed in the Ta or W film by selective etching, sidewalls of the pattern become rough walls because of the appearance of crystal grain boundaries on the sidewalls.

There are proposals of some alloys as X-ray absorbers for X-ray masks. For example, J. Vac. Sci. Technol., B7(6) (1989), pp. 1561–1564 reports on films of $Ta_4B$ alloy which are deposited by sputtering and have an amorphous structure. However, since B is relatively low in X-ray absorbing power, an X-ray mask pattern of $Ta_4B$ must be made greater in film thickness than a Ta pattern in order to realize sufficiently high contrast of the projected pattern image. Jpn. J. Appl. Phys., Vol. 31 (1992), pp. 4210–4214 reports on sputter-deposited W—Ti alloy films containing nitrogen. The W—Ti films have an amorphous structure. However, in X-ray masks a W—Ti film must be made thicker than a W film since Ti is relatively low in X-ray absorbing power. Besides, in sputter deposition operations W—Ti alloys are inferior to Ta in film stress controllability.

JP-A 2-2109 (1990) proposes to use an alloy of Ta with at least one of Al, Ti, Si and Mo (preferably a Ta—Al alloy) as the X-ray absorber in X-ray masks. The alloy may contain nitrogen. However, Al, Ti and Si are relatively low in X-ray absorbing power, and sputter-deposited films of the proposed alloys are liable to have a columnar structure though the crystal grains are finer than in sputter-deposited Ta films. The tendency toward a columnar structure is particularly significant when Mo is used as an alloying element because Mo and Ta have nearly the same atomic radius and hence are liable to form a solid solution. When the proposed alloys contain nitrogen, the X-ray absorption and etchability of the alloys are adversely affected by nitrogen.

SUMMARY OF THE INVENTION

It is an object of the present invention to provide an X-ray mask for X-ray lithography in which an improved X-ray absorber is employed.

It is another object of the invention to provide a method of producing an X-ray mask according to the invention.

The invention provides an X-ray mask comprising a mask pattern of an X-ray absorber on a membrane which is transparent to X-rays, and according to the invention the X-ray absorber is a Ta—Ge (tantalum-germanium) alloy.

For producing an X-ray mask, a method according to the invention comprises the steps of (a) depositing a Ta—Ge alloy film on a membrane transparent to X-rays by sputtering, and (b) patterning the Ta—Ge alloy film to form a mask pattern of the Ta—Ge alloy on the membrane. Preferably, Xe gas is used as the sputtering gas.

As an X-ray absorbing element, Ge has larger mass absorption coefficients than B or Ti particularly for X-ray wavelengths around 10 Å which are useful for 1:1 printing by X-ray lithography. Therefore, when a Ta—Ge alloy film is used to form an X-ray mask pattern, the film can be made thinner than in the case of using a Ta—B or Ta—Ti alloy film to realize similarly high contrast of the projected pattern image.

A Ta—Ge alloy used in this invention consists of a relatively large amount of Ta and a relatively small amount of Ge. Although the content of Ge in the alloy is not strictly limited, it is preferred to use a Ta—Ge alloy containing 5–20% of Ge in atomic percentage.

A Ta—Ge film deposited by sputtering has an amorphous structure. Naturally, this film is free from crystal grain boundaries which become a cause of rough sidewalls when the film is selectively etched to define a fine pattern. Therefore, X-ray mask patterns according to the invention have very smooth sidewalls even when the minimum feature size is than 0.1 μm.

An amorphous Ta—Ge alloy film is high in chemical stability because, besides amorphousness, Ta in the alloy assumes a passive state. Accordingly, the mask pattern defined in the Ta—Ge alloy film hardly undergoes dimensional changes by oxidation.

In a metal or alloy film deposited by sputtering, the internal stress depends on the pressure of the sputtering gas. In a sputter-deposited Ta—Ge film the gas pressure dependence of the internal stress is relatively small as will be illustrated hereinafter. Therefore, it is easy to deposit a low-stress film or a nearly stress-free film by controlling the sputtering gas pressure. Besides, in the deposited film the degree of nonuniformity of the in-plane distribution of stress decreases because fluctuations of the sputtering gas pressure do not seriously influence the stress distribution.

X-ray masks according to the invention are useful in the fabrication of semiconductor integrated circuits and micromachines in which the minimum feature size may be smaller than 0.1 μm.

DESCRIPTION OF THE PREFERRED EMBODIMENTS

Figure 1:
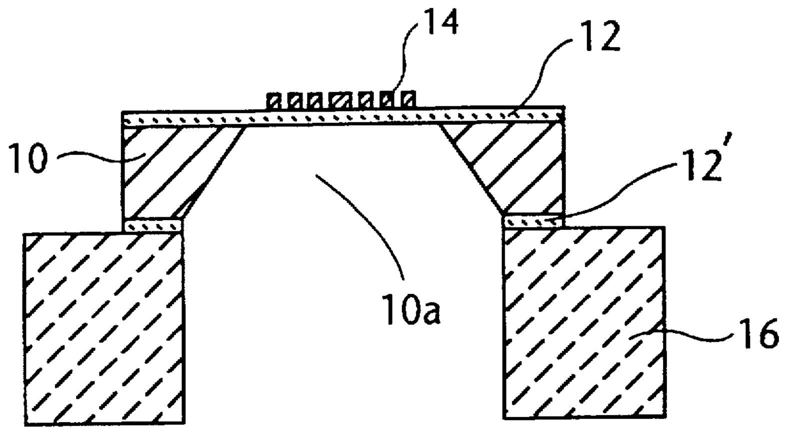
FIG. 1 is a schematic cross-sectional view of an X-ray mask embodying the invention.

FIG. 1 illustrates the construction of an X-ray mask according to the invention. The principal parts of the mask are formed on a substrate 10 which has a sufficiently large aperture 10*a*. For example, the material of the substrate 10 is silicon. A membrane 12 transparent to X-rays lies on a front surface of the substrate 10 so as to cover the aperture 10*a*. On the opposite surface of the substrate 10 there is another membrane 12', but this membrane 12' does not cover the aperture 10*a* and is not essential to the X-ray mask. For example, the membranes 12, 12' are of $Si_3N_4$ or SiC. On the membrane 12, there is a mask pattern 14 of an X-ray absorber in the area above the aperture 10*a* of the substrate 10. In this invention, the X-ray absorber is a Ta—Ge alloy, and the pattern 14 is defined by patterning a Ta—Ge film by the usual lithography and dry etching operations. On the back side, the substrate 10 is bonded to a supporting frame 16 which does not interfere the aperture 10*a*. For example, the supporting frame 16 is made of SiC or quartz glass.

Figure 2:
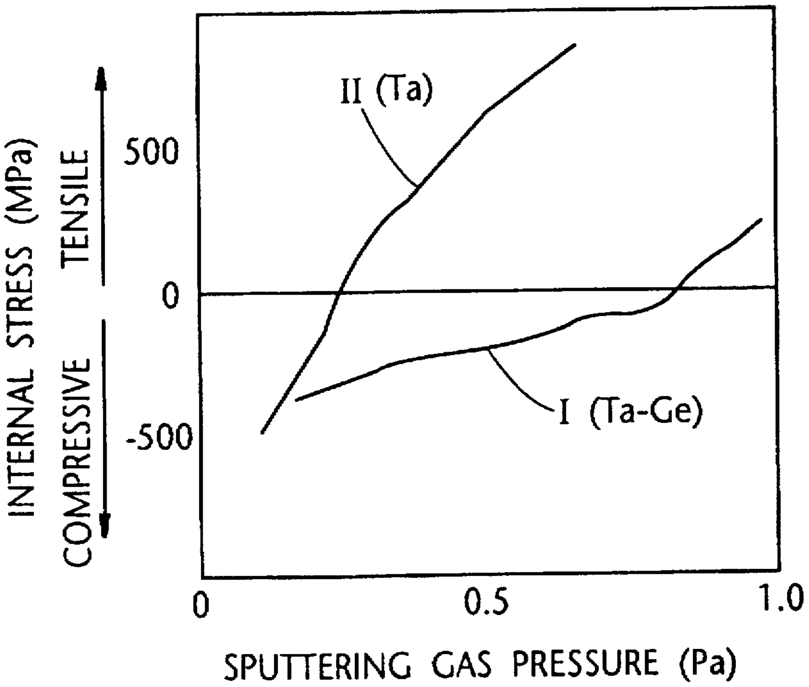
FIG. 2 is a graph showing the dependence of the internal stress of a sputter-deposited film of an X-ray absorber according to the invention on the pressure of the sputtering gas in comparison with a film of another X-ray absorber.

In FIG. 2, the curve I represents the dependence of the internal stress of a sputter-deposited Ta—Ge film on the pressure of the sputtering gas. The film stress is compressive in a relatively low gas pressure region. As the gas pressure increases, the compressive stress changes into tensile stress through a zero stress point. For comparison, the curve II represents the gas pressure dependence of the internal stress of a sputtered film of Ta which is a well known X-ray absorber. It is apparent that Ta—Ge is far smaller than Ta in the gas pressure dependence of the film stress. Therefore, in the case of Ta—Ge it is easy to obtain a low-stress or nearly stress-free film by controlling the sputtering gas pressure. Furthermore, the smallness of the gas pressure dependence of the film stress leads to a decrease in the degree of nonuniformity of the in-plane distribution of stress caused by fluctuations of the gas pressure. Also it is possible to regulate the internal stress of a sputter-deposited TaGe film by subsequent annealing.

Figure 3A:
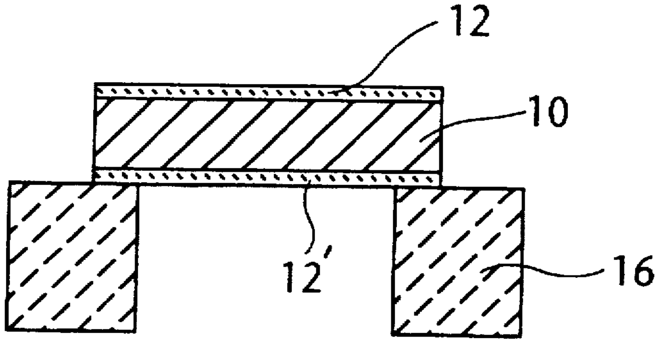
FIGS. 3(A) to 3(C) illustrate, in schematic cross-sectional views, a process of producing the X-ray mask of FIG. 1.
Figure 3B:
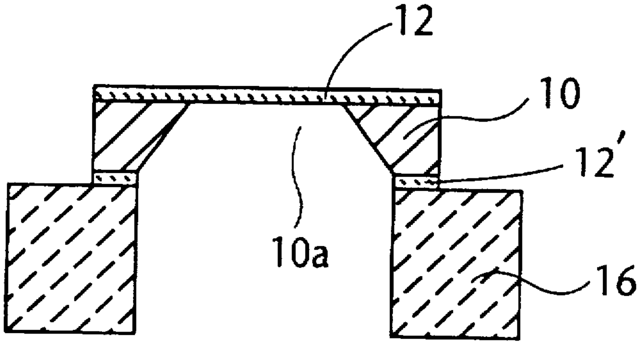
Figure 3C:
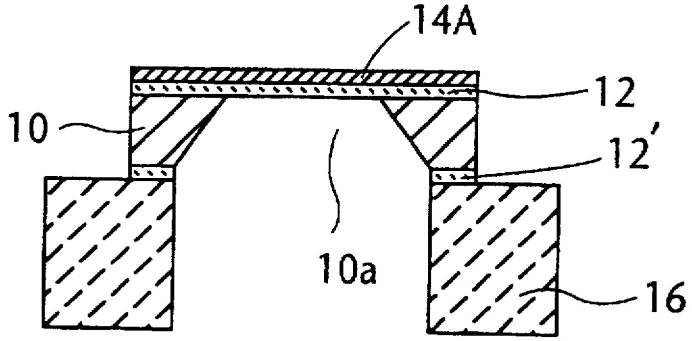

A process of producing the X-ray mask of FIG. 1 is illustrated in FIGS. 3(A) to 3(C).

Referring to FIG. 3(A), the first step is forming SiC films 12 and 12' on the front and back surfaces of a silicon substrate 10 by a CVD process. For example, the substrate 10 has a thickness of 1–2 mm, and the SiC films 12, 12' are deposited to a thickness of 1–2 μm. Next, the supporting frame 16 is bonded to the back side of the substrate 10 with a suitable adhesive such as an epoxy resin. For example, the frame 16 is made of SiC and has a thickness of about 5 mm.

Referring to FIG. 3(B), in the area exposed in the opening of the frame 16 the SiC film 12' is removed by etching, and then the aperture 10*a* is formed in the substrate 10 by anisotropic etching of the silicon substrate 10 through the opening of the frame 16. For example, a KOH solution is used as the etching liquid. In the area above the aperture 10*a*, the SiC film 12 is freed from the substrate 10 and becomes a membrane which transmits X-rays.

Referring to FIG. 3(C), an amorphous Ta—Ge alloy film 14A having a thickness of, for example, 0.1–1 μm is deposited on the SiC film 12 by sputtering using a target of a Ta—Ge alloy. Preferably, Xe gas is used as the sputtering gas. For example, the Xe gas pressure is kept at 0.5 Pa to deposit a low-stress film (14A) by introducing Xe gas into the sputtering chamber at a rate of about 100 sccm, and the discharging power for sputtering is about 1 kW. It is possible to use Ar gas instead of Xe gas, but it is better to use Xe gas. Since Xe is greater in atomic radius, incorporation of the sputtering gas in the deposited film decreases, and therefore the deposited film becomes better in several important characteristics such as stress controllability, stability and density. In the sputter deposition the temperature of the membrane 12 rises, but this is undesirable. So, it is preferable to cool the membrane 12 from the back side with a cooling gas such as helium gas in order to reduce a temperature gradient between the membrane 12 and the silicon substrate 10. The cooling is effective for uniformization of the in-plane distribution of internal stress of the Ta—Ge film 14A.

Finally, the pattern 14 shown in FIG. 1 is created by first forming a resist pattern on the Ta—Ge film 14A and then transferring the resist pattern into the Ta—Ge film 14A by dry etching using a suitable etching gas such as $SF_6$ or $Cl_2$.

Figure 4A:
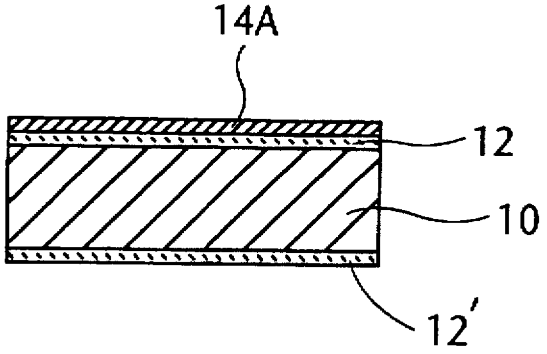
FIGS. 4(A) to 4(C) illustrate, in schematic cross-sectional views, another process of producing the X-ray mask of FIG. 1.
Figure 4B:
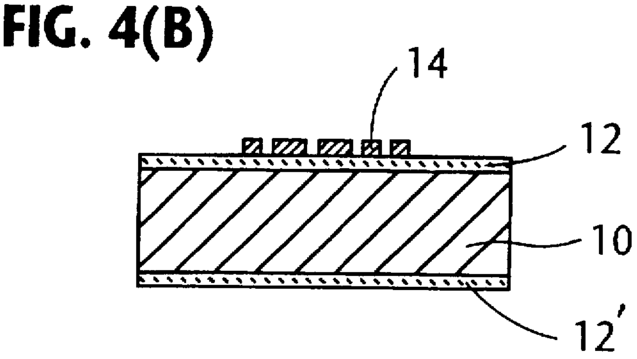
Figure 4C:
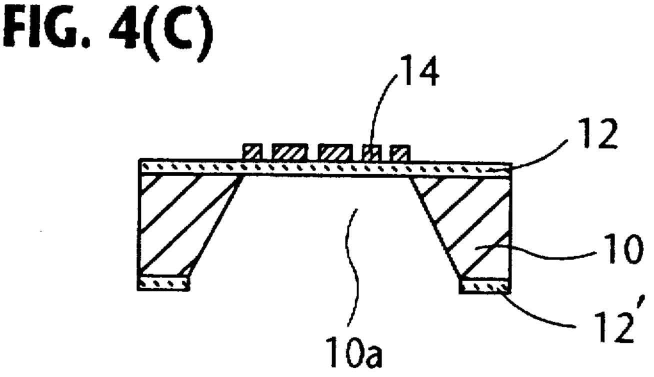

FIGS. 4(A) to 4(C) illustrate another process of producing the X-ray mask of FIG. 1.

Referring to FIG. 4(A), SiC films 12 and 12' are deposited on the front and back surfaces of the silicon substrate 10 by a CVD process. Next, an amorphous Ta—Ge alloy film 14A is deposited on the SiC film 12 by the sputter deposition operation described with reference to FIG. 3(C). However, in the sputter deposition in this process it is unnecessary to use a cooling gas to cool the SiC film 12. Instead of cooling, the substrate 10 is placed on a suitable stage such as a commonly used wafer stage in order to suppress a rise in the temperature of the SiC film 12 by the transfer of heat from the film 12 to the stage through the substrate 10.

Next, the Ta—Ge film 14A in FIG. 3(A) is patterned by lithography and dry etching operations to form a mask pattern 14 as shown in FIG. 3(B).

Referring to FIG. 4(C), in an area under the pattern 14 the SiC film 12' is removed by etching, and then an aperture 10*a* is formed in the substrate 10 by anisotropic etching of the silicon substrate 10 using the remaining part of the SiC film 12' as a mask. After that, the supporting frame 16 shown in FIG. 1 is bonded to the back side of the substrate 10 with an adhesive.

As a modification of this process, the aperture 10*a* in the substrate 10 may be formed soon after the deposition of the Ta—Ge film 14A shown in FIG. 4(A) before patterning the film 14A into the mask pattern 14 in FIG. 4(B).

What is claimed is:

1. An X-ray mask for X-ray lithography, comprising a membrane which is transparent to X-rays and a mask pattern of an X-ray absorber formed on the membrane, wherein the X-ray absorber is a Ta—Ge alloy.

2. An X-ray masked according to claim 1, wherein the alloy consists essentially of Ta and Ge.

3. An X-ray mask according to claim 1, further comprising a substrate in which an aperture is formed, said membrane lying on the substrate such that said mask pattern is located above said aperture.

4. An X-ray masked according to claim 1, wherein the alloy consists of Ta and Ge.

5. A method of producing an X-ray mask for X-ray lithography, comprising the steps of (a) depositing a film of a Ta—Ge alloy on a membrane which is transparent to X-rays by sputtering, and (b) patterning the Ta—Ge alloy film to form a mask pattern of the Ta—Ge alloy on said membrane.

6. A method according to claim 5, wherein said membrane lies on a substrate, the method further comprising the step of forming an aperture in said substrate after the step (a) such that the mask pattern formed in the step (b) is located above said aperture.

7. A method according to claim 5, wherein in the step (a) xenon gas is used as sputtering gas.

8. A method according to claim 5, wherein said membrane lies on a substrate, the method further comprising the step of forming an aperture in said substrate prior to the step (a) such that the mask pattern formed in the step (b) is located above said aperture.

9. An X-ray mask for lithography, comprising a membrane which is transparent to X-rays and a mask pattern of an X-ray absorber formed on the membrane, wherein the X-ray absorber is a Ta—Ge alloy, wherein said Ta—Ge alloy contains 5–20% of Ge in atomic percentage.

10. An X-ray mask according to claim 9, further comprising a substrate in which an aperture is formed, said membrane lying on the substrate such that said mask pattern is located above said aperture.

11. An X-ray mask for lithography, comprising a membrane which is transparent to X-rays and a mask pattern of an X-ray absorber formed on the membrane, wherein the X-ray absorber is a Ta—Ge alloy, wherein the material of said membrane is selected from the group consisting of silicon carbide and silicon nitride.

12. An X-ray mask according to claim 11, further comprising a substrate in which an aperture is formed, said membrane lying on the substrate such that said mask pattern is located above said aperture.

13. A method of producing an X-ray mask for X-ray lithography, comprising the steps of (a) depositing a film of a Ta—Ge alloy on a membrane which is transparent to X-rays by sputtering, and (b) patterning the Ta—Ge alloy film to form a mask pattern of the Ta—Ge alloy on said membrane, wherein said Ta—Ge alloy contains 5–20% of Ge in atomic percentage.

14. A method according to claim 13, wherein said membrane lies on a substrate, the method further comprising the step of forming an aperture in said substrate prior to the step (a) such that the mask pattern formed in the step (b) is located above said aperture.

15. A method according to claim 13, wherein said membrane lies on a substrate, the method further comprising the step of forming an aperture in said substrate after the step (a) such that the mask pattern formed in the step (b) is located above said aperture.

16. A method according to claim 13, wherein in the step (a) xenon gas is used as sputtering gas.

17. A method of producing an X-ray mask for X-ray lithography, comprising the steps of (a) depositing a film of a Ta—Ge alloy on a membrane which is transparent to X-rays by sputtering, and (b) patterning the Ta—Ge alloy film to form a mask pattern of the Ta—Ge alloy on said membrane, wherein the material of said membrane is selected from the group consisting of silicon carbide and silicon nitride.

18. A method according to claim 17, wherein said membrane lies on a substrate, the method further comprising the step of forming an aperture in said substrate after the step (a) such that the mask pattern formed in the step (b) is located above said aperture.

19. A method according to claim 17, wherein in the step (a) xenon gas is used as sputtering gas.

20. A method according to claim 17, wherein said membrane lies on a substrate, the method further comprising the step of forming an aperture in said substrate prior to the step (a) such that the mask pattern formed in the step (b) is located above said aperture.

* * * * *